(12) United States Patent
Wu et al.

(10) Patent No.: US 12,021,544 B2
(45) Date of Patent: Jun. 25, 2024

(54) ANALOG-TO-DIGITAL CONVERSION CIRCUIT, ANALOG-TO-DIGITAL CONVERSION DEVICE, AND DIGITAL X-RAY IMAGING SYSTEM

(71) Applicant: Shanghai United Imaging Microelectronics Technology Co., Ltd., Shanghai (CN)

(72) Inventors: Rong Wu, Irvine, CA (US); Jieyou Zhao, Shanghai (CN); Haichao Zhang, Shanghai (CN)

(73) Assignee: Shanghai United Imaging Microelectronics Technology Co., Ltd., Shanghai (CN)

( * ) Notice: Subject to any disclaimer, the term of this patent is extended or adjusted under 35 U.S.C. 154(b) by 302 days.

(21) Appl. No.: 17/685,935

(22) Filed: Mar. 3, 2022

(65) Prior Publication Data

US 2022/0196855 A1   Jun. 23, 2022

(51) Int. Cl.
  *H03M 1/18* (2006.01)
  *G01T 1/17* (2006.01)
  *H03M 1/16* (2006.01)
  *H03M 1/36* (2006.01)

(52) U.S. Cl.
  CPC ............. *H03M 1/164* (2013.01); *G01T 1/17* (2013.01); *H03M 1/188* (2013.01); *H03M 1/363* (2013.01)

(58) Field of Classification Search
  CPC ...... H03M 1/164; H03M 1/188; H03M 1/363; H03M 1/0612; H03M 1/0604; G01T 1/17; H03F 3/45475; H03F 2203/45048; G05F 1/468; G05F 3/30
  See application file for complete search history.

(56) References Cited

U.S. PATENT DOCUMENTS

| | | | | |
|---|---|---|---|---|
| 2009/0167424 A1* | 7/2009 | Kim | ............ | H03K 17/145 327/543 |
| 2010/0142653 A1* | 6/2010 | Furuta | ............ | H03M 1/0682 341/158 |
| 2010/0194617 A1* | 8/2010 | Oku | ............ | H03M 1/002 330/250 |
| 2016/0274546 A1* | 9/2016 | Kurose | ............ | G04F 10/005 |
| 2016/0359463 A1* | 12/2016 | Kurose | ............ | H03F 3/45 |

* cited by examiner

*Primary Examiner* — Alvaro E Fortich
(74) *Attorney, Agent, or Firm* — Polsinelli PC

(57) ABSTRACT

Disclosed are an analog-to-digital conversion circuit, an analog-to-digital conversion device, and a digital x-ray imaging system. The analog-to-digital conversion circuit includes a first reference voltage source, a second reference voltage source, a first analog-to-digital converter connected to the first reference voltage source, a second analog-to-digital converter connected to the second reference voltage source, a connecting circuit connected to the first analog-to-digital converter and the second analog-to-digital converter, respectively, and a current source having negative temperature coefficient configured to be connected to the first reference voltage source and the second reference voltage source, respectively.

20 Claims, 4 Drawing Sheets

ANALOG-TO-DIGITAL CONVERSION CIRCUIT, ANALOG-TO-DIGITAL CONVERSION DEVICE, AND DIGITAL X-RAY IMAGING SYSTEM

TECHNICAL FIELD

The present application relates to the field of analog-to-digital circuits, particularly, to an analog-to-digital conversion (ADC) circuit, an analog-to-digital conversion device, and a digital x-ray imaging system.

BACKGROUND

The two-stage analog-to-digital converter has a good overall performance among high speed, high precision, and low power consumption, and is usually applied in high-definition image and video processing field, wireless communication field, etc. The two-stage analog-to-digital converter may also be applied to digital X-ray imaging systems. In the related technology, in the two-stage analog-to-digital converter, a gain error is usually caused by a mismatch between a reference voltage source of the first-stage analog-to-digital converter and a reference voltage source of the second-stage analog-to-digital converter.

SUMMARY

In view of this, it is necessary to provide an ADC circuit, an analog-to-digital conversion device, and a digital x-ray imaging system to solve a problem that in the two-stage analog-to-digital converter, a gain error is usually caused by a mismatch between the reference voltage source of the first-stage analog-to-digital converter and the reference voltage source of the second-stage analog-to-digital converter.

The ADC circuit includes a first reference voltage source, a second reference voltage source, a first analog-to-digital converter connected to the first reference voltage source, a second analog-to-digital converter connected to the second reference voltage source, a connecting circuit connected to the first analog-to-digital converter and the second analog-to-digital converter, respectively, and a current source having negative temperature coefficient, configured to be connected to the first reference voltage source and the second reference voltage source, respectively.

In an embodiment, the ADC circuit is a two-staged analog-to-digital converter.

In an embodiment, the current source having negative temperature coefficient includes a voltage buffer circuit having negative temperature coefficient, connected to the first reference voltage source and the second reference voltage source, respectively.

In an embodiment, the current source having negative temperature coefficient further includes a voltage generating circuit having negative temperature coefficient connected to the voltage buffer circuit having negative temperature coefficient.

In an embodiment, the current source having negative temperature coefficient further includes a starting circuit connected to the voltage generating circuit having negative temperature coefficient.

In an embodiment, the voltage generating circuit having negative temperature coefficient includes a first operational amplifier having an output connected to the starting circuit.

In an embodiment, the voltage generating circuit having negative temperature coefficient further includes a first branch circuit connected to an inverting input of the first operational amplifier and the starting circuit, and a second branch circuit connected to a non-inverting input of the first operational amplifier and the starting circuit. An output voltage of the voltage generating circuit having negative temperature coefficient is adjusted to have a negative temperature characteristic by adjusting the first branch circuit and the second branch circuit.

In an embodiment, the first branch circuit is configured to generate a current with positive temperature coefficient and to provide the current for the second branch circuit. The second branch circuit is configured to generate the output voltage.

In an embodiment, the first branch circuit includes a transistor M5, a bipolar junction transistor (BJT) Q2, and a resistor R1. The second branch circuit comprises a transistor M6, a BJT Q3, and a resistor R2.

In an embodiment, the output voltage of the voltage generating circuit having negative temperature coefficient is adjusted to have the negative temperature characteristic by adjusting a ratio of a resistance of the resistor R2 to a resistance of the resistor R1.

In an embodiment, the voltage generating circuit having negative temperature coefficient includes a transistor M4 and a BJT Q1. A drain of the transistor M4 is connected to an emitter of the BJT Q1, a source of the transistor M4 is connected to the external power supply, a gate of the transistor M4 is connected to the output of the first operational amplifier, a collector and a base of the BJT Q1 are connected to the ground, and the inverting input of the first operational amplifier is connected to the drain of the transistor M4 and the emitter of the BJT Q1, respectively.

In an embodiment, the first branch circuit further includes a transistor M5 and a BJT Q2. A gate of the transistor M5 is connected to the gate of the transistor M4, a source of the transistor M5 is connected to the external power supply, a drain of the transistor M5 is connected to a first end of the resistor R1 and a noninverting input of the first operational amplifier, respectively, and a second end of the resistor R1 is connected to an emitter of the BJT Q2.

In an embodiment, the second branch circuit further includes a transistor M6 and a BJT Q3. A source of the transistor M6 is connected to the external power supply, a drain of the transistor M6 is connected to a first end of the resistor R2 and the voltage buffer circuit having negative temperature coefficient, respectively, a gate of the transistor M6 is connected to the output of the first operational amplifier, and a second end of the resistor R2 is connected to an emitter of the BJT Q3.

In an embodiment, the voltage buffer circuit having negative temperature coefficient includes a second operational amplifier. An inverting input of the second operational amplifier is connected to the drain of the transistor M6. An output of the second operational amplifier is connected to the first reference voltage source and the second reference voltage source, respectively.

In an embodiment, the voltage buffer circuit having negative temperature coefficient further includes a transistor M8 and a resistor R3. A source of the transistor M8 is connected to the external power supply, a drain of the transistor M8 is connected to a first end of the resistor R3, the first end of the resistor R3 is connected to a noninverting input of the second operational amplifier, and a second end of the resistor R3 is connected to the ground.

In an embodiment, the connecting circuit includes an intermediate amplification circuit, connected to the first analog-to-digital converter and the second analog-to-digital converter, respectively.

In an embodiment, the ADC circuit further includes a gain calibration circuit connected to the intermediate amplification circuit.

In an embodiment, a structure of the first reference voltage source is the same as that of the second reference voltage source.

The analog-to-digital conversion device includes the analog-to-digital conversion circuit described above.

The digital x-ray imaging system includes the analog-to-digital conversion device above.

In the analog-to-digital conversion circuit, the analog-to-digital conversion device and the digital x-ray imaging system provided by embodiments of the present application, the current source having negative temperature coefficient is connected to the first reference voltage source and the second reference voltage source, respectively. The current source having negative temperature coefficient is configured to reduce the influence of the temperature change on the output voltage of the first reference voltage source and the output voltage of the second reference voltage source. At a high temperature stage, the current source having negative temperature coefficient may offset an increase of the output voltage of the first reference voltage source and an increase of the output voltage of the second reference voltage source, which are caused by the increase in temperature. At a low temperature stage, the current source having negative temperature coefficient will not affect the output voltages of the first reference voltage source and second reference voltage source. Therefore, the gain error caused by the mismatch between the first reference voltage source and the second reference voltage source is reduced or eliminated.

BRIEF DESCRIPTION OF THE DRAWINGS

In order to describe the technical solutions in the embodiments of the present application or in the related technology more clearly, the accompanying drawings to be used in the description of the embodiments or in the description of the related technology will be briefly introduced. Obviously, the accompanying drawings described below are merely some embodiments of the present application, and for those of ordinary skill in the art, other drawings may be obtained according to these accompanying drawings without creative work.

Figure 1:
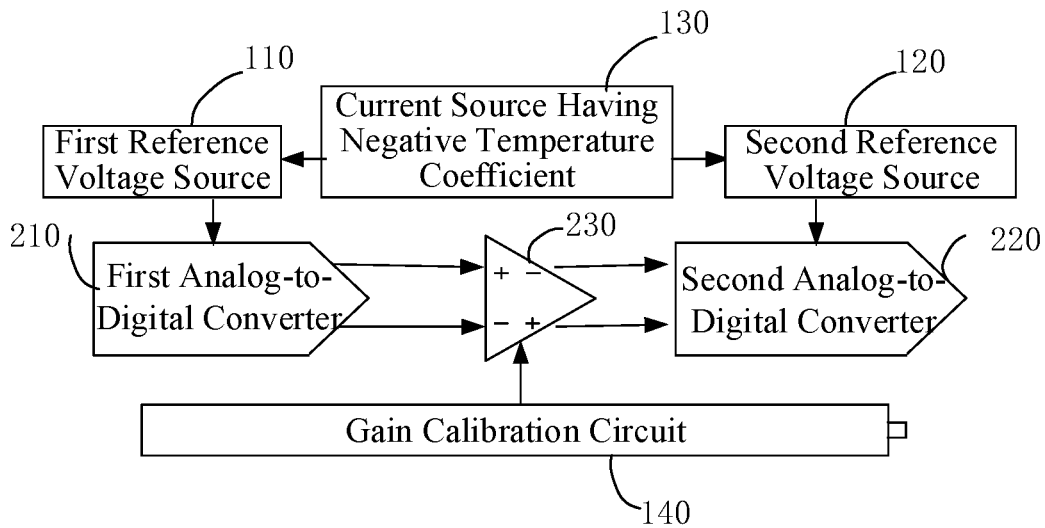
FIG. 1 is a structural diagram showing an analog-to-digital conversion circuit provided by an embodiment of the present application.

DESCRIPTION OF REFERENCE NUMERALS 10. analog-to-digital conversion (ADC) circuit, 110. first reference voltage source, 120. second reference voltage source, 210. first analog-to-digital converter, 220. second analog-to-digital converter, 230. connecting circuit, 231. intermediate amplification circuit, 130. current source having negative temperature coefficient, 132. starting circuit, 136. voltage generating circuit having negative temperature coefficient, 134. voltage buffer circuit having negative temperature coefficient, 140. gain calibration circuit, 112. first operational amplifier, 114. second operational amplifier, 137. first branch circuit, 138. Second branch circuit.

DETAILED DESCRIPTION OF THE EMBODIMENTS

In order to make the objectives, technical solutions, and advantages of the present application clearer and understood, the embodiments of the present application will be further described in detail by combining with the attached drawings. It should be understood that the specific embodiments described herein are only used to explain the present application, but not intended to limit the present application.

The serial numbers assigned to the components herein, such as "first", "second", etc., are only used to distinguish the described objects but do not have any sequence or technical meanings. The "connection" and "link" mentioned in the present application include direct and indirect connection (link) unless otherwise specified. In the description of the present application, it should be understood that the terms "upper", "lower", "front", "rear", "left", "right", "vertical", "horizontal", "top", "bottom", "inner", "outer", "clockwise", "counterclockwise", etc. indicating the orientation or positional relationship are based on the orientations or positional relationships shown in the drawings, and are only for the convenience of describing the present application and simplifying the description, rather than indicating or implying that the device or element must have a specific orientation, and must be constructed and operated in a specific orientation, and therefore cannot be understood to be a limitation on the present application.

In the present application, unless expressly stipulated and defined, a first feature "on" or "under" a second feature may be that the first feature is in direct contact with the second feature, or may be that the first feature is in contact with the second feature by means of an intermediate media. Moreover, the first feature "over", "above", and "on" the second feature may mean that the first feature is directly over or obliquely above the second feature, or simply means that a level height of the first feature is higher than that of the second feature. The first feature "below", "under", and "down" the second feature may mean that the first feature is directly under or obliquely below the second feature, or simply means that the level height of the first feature is less than the second feature.

Referring to FIG. 1, an embodiment of the present application provides an analog-to-digital conversion (ADC) circuit 10. The ADC circuit 10 includes a first reference voltage source 110, a second reference voltage source 120, a first analog-to-digital converter 210, a second analog-to-digital converter 220, a connecting circuit 230, and a current source 130 having negative temperature coefficient. The first analog-to-digital converter 210 is connected to the first reference voltage source 110. The second analog-to-digital converter 220 is connected to the second reference voltage source 120. The connecting circuit 230 is connected to the first analog-to-digital converter 210 and the second analog-to-digital converter 220, respectively. The current source 130 having negative temperature coefficient is configured to be connected to the first reference voltage source 110 and the second reference voltage source 120, respectively. The current source 130 having negative temperature coefficient is configured to reduce the influences of temperature changes on the output voltages of the first reference voltage source 110 and second reference voltage source 120.

The first reference voltage source 110 and the second reference voltage source 120 may be integrated in a chip. An external power supply is input into the chip, and outputted by the first reference voltage source 110 and the second reference voltage source 120 as reference levels of the first analog-to-digital converter 210 and the second analog-to-digital converter 220.

In a digital x-ray imaging system, when X-rays irradiate the imaging plate, electric charges are generated and are converted to a voltage. The voltage is sampled and quantized by a two-stage analog-to-digital converter. The first analog-to-digital converter 210 may roughly quantize the sampled signal, and output a digital code and a residual signal. The residual signal is scaled by the connecting circuit 230 and then may be sampled by the second analog-to-digital converter 220. The residual signal is further finely quantized to output a digital code. After the output digital codes of the first analog-to-digital converter 210 and the second analog-to-digital converter 220 are processed by a digital circuit, a 16-bit digital code may be obtained. The digital code is processed by the FPGA and then processed by an image processing software to form real image information.

In this embodiment, the analog-to-digital conversion circuit 10 may include n reference voltage sources, n analog-to-digital converters, m connecting circuits 230 and m current sources having negative temperature coefficient 130. The number n may be an integer greater than or equal to 2, and m may be an integer greater than or equal to 1.

Each reference voltage source in the analog-to-digital conversion circuit 10 is connected to a corresponding analog-to-digital converter. If m is less than or equal to (n−1) and greater than or equal to 1, at least one current source having negative temperature coefficient 130 in the analog-to-digital conversion circuit 10 is connected to at least two reference voltage sources, and each connection circuit 230 is connected to at least two analog-to-digital converters. The current source having negative temperature coefficient 130 is configured to reduce the influence of temperature variations on the output voltage of each reference voltage source. The circuit structure and working principle of each reference voltage source in the analog-to-digital conversion circuit 10 may be the same as those of the first reference voltage source 110 and the second reference voltage source 120. The circuit structure and the operating principle of each analog-to-digital converter in the analog-to-digital conversion circuit 10 may be the same as those of the first analog-to-digital converter 210 and the second analog-to-digital converter 220.

The analog-to-digital conversion circuit 10 is a two-staged analog-to-digital converter. The connecting circuit 230 includes an intermediate amplification circuit 231 connected to the first analog-to-digital converter 210 and the second analog-to-digital converter 220, respectively.

Taking the analog-to-digital conversion circuit 10 being the two-staged analog-to-digital converter as an example, the two-staged analog-to-digital converter includes the first analog-to-digital converter 210 and the second analog-to-digital converter 220, and the connecting circuit 230 includes the intermediate amplification circuit 231.

A temperature of the ADC circuit 10 may change during an operation of the ADC circuit 10, and may increase after the ADC circuit 10 runs for a long time. The temperature change of the ADC circuit 10 will cause an offset of the output voltage of the first reference voltage source 110 and an offset of the output voltage of the second reference voltage source 120, thus causing an unpredictable mismatch to occur between the first reference voltage source 110 and the second reference voltage source 120, and seriously affecting accuracy and linearity of the analog-to-digital converter. The current source 130 having negative temperature coefficient is connected to the first reference voltage source 110 and the second reference voltage source 120, respectively. The current source 130 having negative temperature coefficient is configured to reduce the influence of the temperature change on the output voltage of the first reference voltage source 110 and the output voltage of the second reference voltage source 120. At a high temperature stage, the current source 130 having negative temperature coefficient may offset an increase of the output voltage of the first reference voltage source 110 and an increase of the output voltage of the second reference voltage source 120, which are caused by the increase in temperature. At a low temperature stage, the current source 130 having negative temperature coefficient will not affect the output voltages of the first reference voltage source 110 and second reference voltage source 120. Therefore, the gain error caused by the mismatch between the first reference voltage source 110 and the second reference voltage source 120 is reduced or eliminated.

Figure 2:
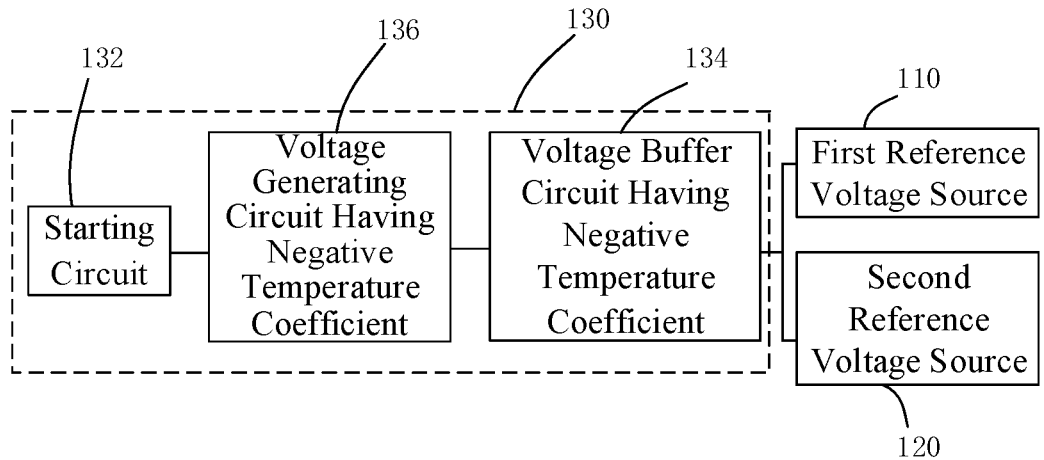
FIG. 2 is a structural diagram showing a current source having negative temperature coefficient, a first reference voltage source, and a second reference voltage source provided by an embodiment of the present application.

Referring to FIG. 2, in an embodiment, the current source 130 having negative temperature coefficient includes a voltage buffer circuit 134 having negative temperature coefficient. The voltage buffer circuit 134 having negative temperature coefficient is connected to the first reference voltage source 110, and the second reference voltage source 120, respectively. The current source 130 having negative temperature coefficient further includes the voltage generating circuit 136 having negative temperature coefficient, and the voltage generating circuit 136 is connected to the voltage buffer circuit 134. At the high temperature stage, the voltage generating circuit 136 having negative temperature coefficient may offset the increase in the output voltages of the first reference voltage source 110 and second reference voltage source 120 caused by the increase in temperature. At the low temperature stage, the voltage generating circuit 136 having negative temperature coefficient will not have influences on the output voltages of the first reference voltage source 110. The voltage buffer circuit 134 having negative temperature coefficient may play a role of isolation. The voltage buffer circuit 134 having negative temperature coefficient may prevent the output voltage $V_{BG}$ of the voltage generating circuit 136 having negative temperature coefficient from being interfered by a subsequent stage, thereby improving stability.

In an embodiment, the current source 130 having negative temperature coefficient includes a starting circuit 132. The voltage generating circuit 136 having negative temperature coefficient is connected to the starting circuit 132. The starting circuit 132 is configured to ensure that the ADC circuit 10 can start normally when the ADC circuit 10 is powered on. The starting circuit 132 may also be turned off after the ADC circuit 10 is powered on, so as to reduce power consumption.

Figure 3:
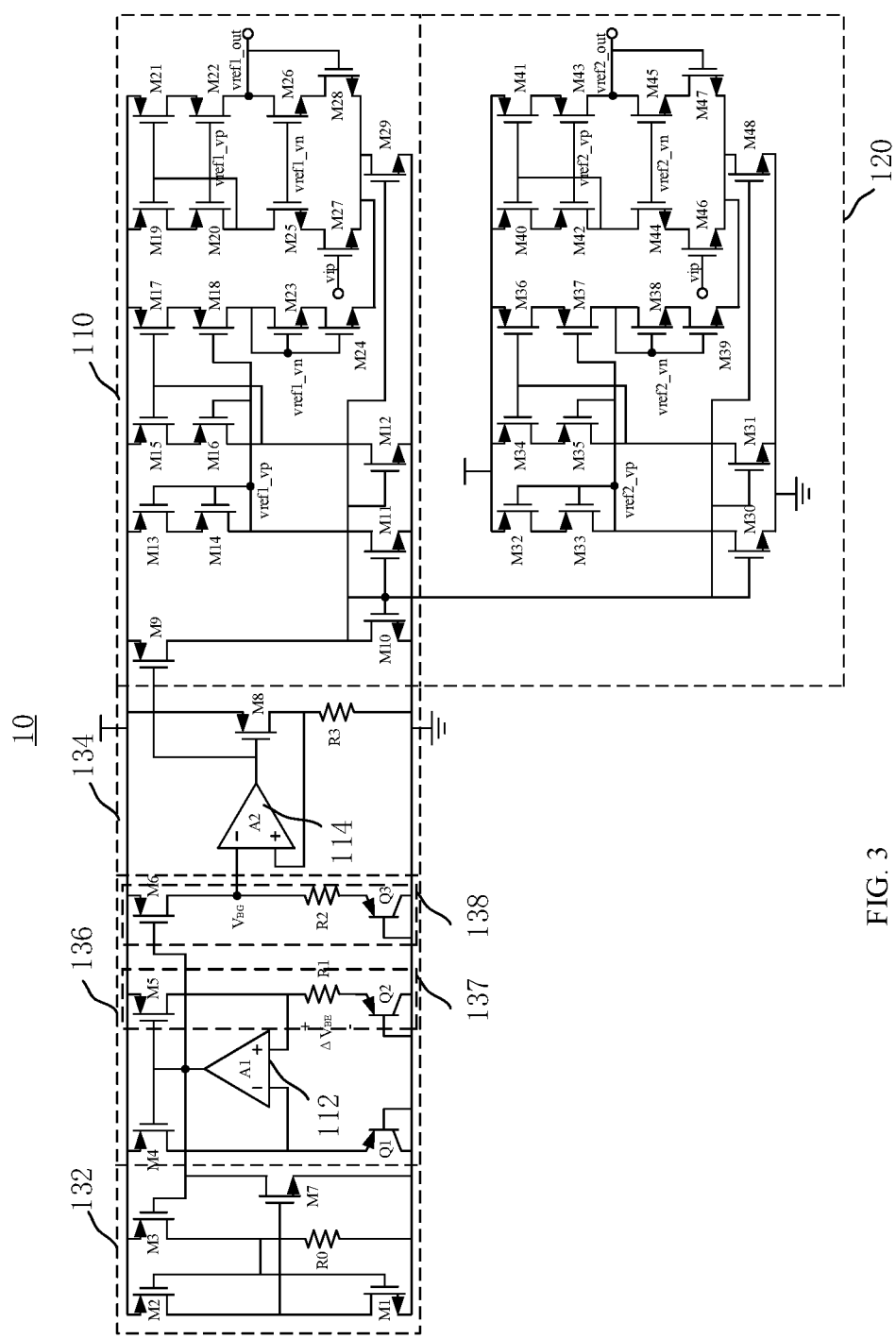
FIG. 3 is a structural diagram of the analog-to-digital conversion circuit provided by another embodiment of the present application.

Referring to FIG. 3, in an embodiment, the starting circuit 132. includes a transistor M1, a transistor M2, a transistor M3, a resistor R0, and a transistor M7. A source of the transistor M1 is connected to the ground. A drain of the transistor M1 is connected to a drain of the transistor M2. A source of the transistor M2 is connected to an external power supply. A gate of the transistor M1 is connected to the gate of the transistor M2. A first end of the resistor R0 is connected to the gate of the transistor M1, the gate of the transistor M2, and a drain of the transistor M3, respectively. A second end of the resistor R0 is connected to the ground. A source of the transistor M3 is connected to the external power supply. A gate of the transistor M7 is connected to the drain of the transistor M1 and the drain of the transistor M2, respectively. A drain of the transistor M7 is connected to a gate of the transistor M3 and the voltage generating circuit 136 having negative temperature coefficient, respectively. A source of the transistor M7 is connected to the ground. The transistor M2 and the transistor M3 may be P-type MOSFETs, and the transistor M1 and the transistor M7 may be N-type MOSFETs.

In an embodiment, the voltage generating circuit 136 having negative temperature coefficient includes a first operational amplifier 112. The voltage generating circuit 136 having negative temperature coefficient further includes a first branch circuit 137, a second branch circuit 138. The first branch circuit 137 and an inverting input of the first operational amplifier 112 are connected to the starting circuit 132. The second branch circuit 138 and a non-inverting input of the first operational amplifier 112 are connected to the starting circuit. An output voltage of the voltage generating circuit 136 having negative temperature coefficient is adjusted to have a negative temperature characteristic by adjusting the resistance ratio of resistor in the first branch circuit 137 to the resistor in the second branch circuit 138.

In an embodiment, the first branch circuit 137 is configured to generate a current having positive temperature coefficient, and provide the current for the second branch circuit 138 through mirroring. The second branch circuit 138 is configured to generate an output voltage $V_{BG}$ of a bandgap.

In an embodiment, the first branch circuit 137 includes a transistor M5, a BJT Q2, and a resistor R1. The second branch circuit 138 includes a transistor M6, a BJT Q3, and a resistor R2.

In an embodiment, on the basis of the output voltage $V_{BG}$ of the bandgap reference output by the voltage generating circuit 136 having negative temperature coefficient, the output voltage of the voltage generating circuit 136 having negative temperature coefficient is adjusted to have a negative temperature characteristic by adjusting the resistance ratio of the resistance of resistor R2 to the resistance of resistor R1.

In an embodiment, the voltage generating circuit 136 having negative temperature coefficient includes a transistor M4 and a bipolar junction transistor (BJT) Q1. The first branch circuit 137 includes a transistor M5 and a BJT Q2. The second branch circuit 138 includes a transistor M6 and a BJT Q3. A drain of the transistor M4 is connected to an emitter of the BJT Q1. A source of the transistor M4 is connected to the external power supply. A gate of the transistor M4 is connected to the output of the first operational amplifier 112. A collector and a base of the BJT Q1 are connected to the ground. An inverting input of the first operational amplifier 112 is connected to the drain of the transistor M4 and the emitter of the BJT Q1, respectively. A gate of the transistor M5 is connected to the gate of the transistor M4. A source of the transistor M5 is connected to the external power supply. A drain of the transistor M5 is connected to a first end of the resistor R1 and a noninverting input of the first operational amplifier 112, respectively. A second end of the resistor R1 is connected to an emitter of the BJT Q2. A collector and a base of the BJT Q2 are connected to the ground. A source of the transistor M6 is connected to the external power supply. A drain of the transistor M6 is connected to a first end of the resistor R2 and the voltage buffer circuit 134 having negative temperature coefficient, respectively. A gate of the transistor M6 is connected to the output of the first operational amplifier 112. A second end of the resistor R2 is connected to an emitter of the BJT Q3, and a collector and a base of the BJT Q3 are connected to the ground.

The transistor M4, the transistor M5 and the transistor M6 may be P-type MOSFETs, and the transistor M7 may be an N-type MOSFET.

The transistor M1 and the transistor M2 constitute an inverter. The first end of the resistor R0 is connected to the gate of the transistor M1 and the gate of the transistor M2, respectively, to generate an input of the inverter. At a power-on stage, the gate voltage of the transistor M2 may be a low level, and the output of the inverter is a high level, and at this time the transistor M7 is turned on. The conduction of the transistor M7 pulls down gate potentials of the transistor M3, transistor M4, and transistor M5. Then, the transistor M3, the transistor M4, and the transistor M5 are turned on. Three branches of the transistor M3, transistor M4 and transistor M5 generate a starting current, while a voltage of the first end of the resistor R0 gradually increases. Then, the output of the inverter jumps to be a low level, and the transistor M7 is turned off. The starting circuit 132 finishes starting.

The first operational amplifier 112 has the characteristics of virtual short and virtual disconnection, therefore, the electric potential at the first end of the resistor R1 is the emitter-base voltage $V_{BE1}$ of the BJT Q1, and the electric potential at the second end of the resistor R1 is the emitter-base voltage $V_{BE2}$ of the BJT Q2, and the voltage across the resistor R1 is $\Delta V_{BE}=V_{BE1}-V_{BE2}$. The current generated in the branch of the resistor R1 is $\Delta V_{BE}/R1$, and presents a characteristic of being positively correlated with temperature. After the current in the branch of the resistor R1 is mirrored by the transistor M6, a current in the branch of the BJT Q3 is generated. A bandgap reference voltage $V_{BG}$ is obtained by the voltage across the resistor R2 plus an emitter-base voltage $V_{BE3}$ of the BJT Q3, which is expressed as: $V_{BG}=R2\times\Delta V_{BE}/R1+V_{BE3}$. Since the emitter-base voltage $V_{BE3}$ presents the characteristic of being negatively correlated with temperature, the temperature characteristic of the output voltage $V_{BG}$ may be adjusted by a ratio of the resistance R2 to the resistance R1, thereby adjusting the temperature characteristic of the output voltage $V_{BG}$ to be a characteristic of having a negative temperature coefficient.

Figure 4:
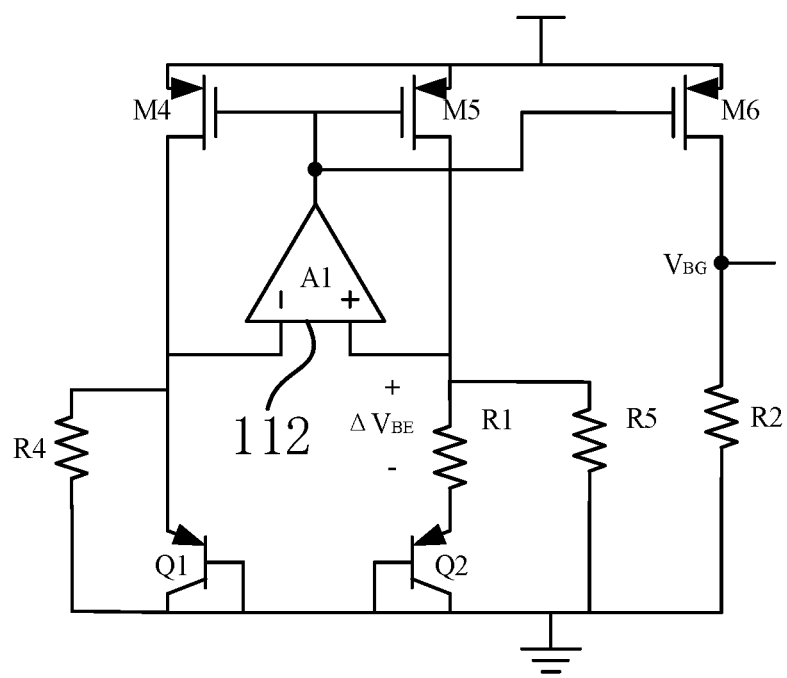
FIG. 4 is a schematic diagram of a voltage generating circuit having negative temperature coefficient provided by an embodiment of the present application.

Please refer to FIG. 4, in an embodiment, different from the voltage generating circuit 136 having negative temperature coefficient shown in FIG. 3, the voltage generating circuit 136 having negative temperature coefficient in this embodiment does not include the second branch circuit 138. The voltage generating circuit 136 having negative temperature coefficient includes a resistor R4, a resistor R1 and a resistor R5. Two ends of the resistor R4 are connected to the collector of the BJT Q1 and the emitter of the BJT Q1, respectively. Two ends of the resistor R1 are connected to the non-inverting input of the first operational amplifier 112 and the emitter of the BJT Q2, respectively. Two ends of the resistor R5 are connected to the non-inverting input of the first operational amplifier 112 and the collector of the BJT Q2, respectively.

The resistance of the resistor R4 may be equal to the resistance of the resistor R5. The resistor R1 may be configured to generate a positive temperature coefficient current, and the resistor R2 may be configured to generate a current of an output stage. A current with a negative temperature coefficient may be obtained by adjusting a ratio of the resistor R1 to the resistor R2.

In an embodiment, the voltage generating circuit 136 having negative temperature coefficient includes a second operational amplifier 114. An inverting input of the second operational amplifier 114 is connected to the drain of the transistor M6, and an output of the second operational amplifier 114 is connected to the first reference voltage source 110 and the second reference voltage source 120, respectively. The voltage generating circuit 136 having negative temperature coefficient further includes a transistor M8, and a resistor R3. A source of the transistor M8 is connected to the external power supply. A drain of the transistor M8 is connected to a first end of the resistor R3. The first end of the resistor R3 is connected to a noninverting input of the second operational amplifier 114. A second end of the resistor R3 is connected to the ground. After the voltage $V_{BG}$ is generated, the voltage $V_{BG}$ is applied to the resistor R3 through the second operational amplifier 114 to generate a reference bias current. The second operational amplifier 114 plays a role of isolation, so that the fluctuation of the circuit of the subsequent stage will not affect the output voltage $V_{BG}$ of the voltage generating circuit 136 having negative temperature coefficient of a preceding stage, and the stability of the circuit is improved.

In an embodiment, the first reference voltage source 110 includes a transistor M9, a transistor M10, a transistor M11, a transistor M13, a transistor M14, a transistor M12, a transistor M15, a transistor M16, a transistor M17, a transistor M18, a transistor M23, a transistor M24, a transistor M19, a transistor M20, a transistor M25, a transistor M27, a transistor M21, a transistor M22, a transistor M26, a transistor M28, and a transistor M29. A source of the transistor M9 is connected to the external power supply. A drain of the transistor M9 is connected to a drain of the transistor M10. The drain of the transistor M10 is connected to a gate of the transistor M10 and the second reference voltage source 120, respectively. A source of the transistor M11 is connected to the ground. A gate of the transistor M11 is connected to the gate of the transistor M10. A source of the transistor M13 is connected to the external power supply. A drain of the transistor M13 is connected to a source of the transistor M14. A gate of the transistor M13 is connected to a gate of the transistor M14. A drain of the transistor M14 is connected to a drain of the transistor M11. The gate of the transistor M14 is connected to a drain of the transistor M14. A source of the transistor M12 is connected to the ground. A drain of the transistor M12 is connected to a drain of the transistor M16. A gate of the transistor M12 is connected to the drain of the transistor M10. A source of the transistor M15 is connected to the external power supply. A drain of the transistor M15 is connected to a source of the transistor M16. A gate of the transistor M16 is connected to the drain of the transistor M14.

A source of the transistor M17 is connected to the external power supply. A drain of the transistor M17 is connected to a source of the transistor M18. A gate of the transistor M17 is connected to a gate of the transistor M15. A drain of the transistor M18 is connected to a drain of the transistor M23. A gate of the transistor M18 is connected to the gate of the transistor M16. A gate of the transistor M23 is connected to the drain of the transistor M18 and a gate of the transistor M24, respectively. A source of the transistor M23 is connected to a drain of the transistor M24.

A source of the transistor M19 is connected to the external power supply. A drain of the transistor M19 is connected to a source of the transistor M20. A gate of the transistor M19 is connected to a drain of the transistor M20. The drain of the transistor M20 is connected to a drain of the transistor M25. A source of the transistor M25 is connected to a drain of the transistor M27. A gate of the transistor M27 is configured to be connected to a noninverting terminal vip of the first reference voltage source 110, and a source of the transistor M27 is connected to a source of the transistor M24.

A source of the transistor M21 is connected to the external power supply. A drain of the transistor M21 is connected to a source of the transistor M22. A gate of the transistor M21 is connected to the gate of the transistor M19 and the drain of the transistor M25, respectively. A gate of the transistor M22 is connected to a gate of the transistor M20. A drain of the transistor M22 is connected to a drain of the transistor M26. A gate of the transistor M26 is connected to a gate of the transistor M25. A source of the transistor M26 is connected to a drain of the transistor M28. A source of the transistor M28 is connected to a drain of the transistor M29 and the source of the transistor M27, respectively. A gate of the transistor M28 is connected to the drain of the transistor M26. A source of the transistor M29 is connected to the ground. A gate of the transistor M29 is connected to the drain of the transistor M10. The transistor M9, the transistor M13, the transistor M14, the transistor M15, the transistor M16, the transistor M17, the transistor M18, the transistor M19, the transistor M20, the transistor M21, and the transistor M22 may be P-type MOSFETs.

The transistor M10, the transistor M11, the transistor M12, the transistor M23, the transistor M24, the transistor M25, the transistor M26, the transistor M27, the transistor M28, and the transistor M29 may be N-type MOSFETs.

In an embodiment, the second reference voltage source 120 includes a transistor M32, a transistor M33, a transistor M30, a transistor M34, a transistor M35, a transistor M31, a transistor M36, a transistor M37, a transistor M38, a transistor M39, a transistor M40, a transistor M42, a transistor M44, a transistor M46, a transistor M41, a transistor M43, a transistor M45, a transistor M47, and a transistor M48.

A source of the transistor M32 is connected to the external power supply. A drain of the transistor M32 is connected to a source of the transistor M33. A gate of the transistor M32 is connected to a gate of the transistor M33. A drain of the transistor M33 is connected to the gate of the transistor M33 and a drain of the transistor M30, respectively. A gate of the transistor M30 is connected to the gate of the transistor M10, and a source of the transistor M30 is connected to the ground.

A source of the transistor M34 is connected to the ground. A drain of the transistor M34 is connected to a source of the transistor M35. A gate of the transistor M34 is connected to a drain of the transistor M35. A gate of the transistor M35 is connected to the gate of the transistor M33. The drain of the transistor M35 is connected to a drain of the transistor M31. A source of the transistor M31 is connected to the ground. A gate of the transistor M31 is connected to the gate of the transistor M10.

A source of the transistor M36 is connected to the external power supply. A gate of the transistor M36 is connected to the gate of the transistor M34. A drain of the transistor M36 is connected to a source of the transistor M37. A gate of the transistor M37 is connected to the gate of the transistor M35 and the gate of the transistor M33, respectively. A drain of the transistor M37 is connected to a drain of the transistor M38, a gate of the transistor M38, and a gate of the transistor M39, respectively. A source of the transistor M38 is connected to a drain of the transistor M39.

A source of the transistor M40 is connected to the external power supply. A drain of the transistor M40 is connected to a source of the transistor M42. A gate of the transistor M40 is connected to a drain of the transistor M42. The drain of the transistor M42 is connected to a drain of the transistor M44. A source of the transistor M44 is connected to a drain of the transistor M46. A gate of the transistor M46 is configured to connect a noninverting terminal of the second reference voltage source 120. A source of the transistor M46 is connected to a source of the transistor M39.

A source of the transistor M41 is connected to the external power supply. A drain of the transistor M41 is connected to a source of the transistor M43. A gate of the transistor M41 is connected to a gate of the transistor M40. A gate of the transistor M43 is connected to a gate of the transistor M42. A drain of the transistor M43 is connected to a drain of the transistor M45 and a gate of the transistor M47, respectively. A gate of the transistor M45 is connected to a gate of the transistor M44. A source of the transistor M45 is connected to a drain of the transistor M47. A source of the transistor M47 is connected to the source of the transistor M46 and a drain of the transistor M48, respectively. A gate of the transistor M48 is connected to the gate of the transistor M10, and a source of the transistor M48 is connected to the ground.

The transistor M32, the transistor M33, the transistor M34, the transistor M35, the transistor M36, the transistor M37, the transistor M40, the transistor M41, the transistor M42, and the transistor M43 may be P-type MOSFETs.

The transistor M30, the transistor M31, the transistor M38, the transistor M39, the transistor M44, the transistor M45, the transistor M46, the transistor M47, and the transistor M48 may be N-type MOSFETs.

The circuit structures and working principles of the first reference voltage source 110 and the second reference voltage source 120 may be identical. The first reference voltage source 110 and the second reference voltage source 120 may share the current source 130 having negative temperature coefficient. The circuit structures of the first reference voltage source 110 and the second reference voltage source 120 are identical, thus avoiding mutual influences on the reference voltages when the first analog-to-digital converter 210 and the second analog-to-digital converter 220 work alternately.

Taking the first reference voltage source 110 as an example, the current generated by the current source 130 having negative temperature coefficient is mirrored by the transistor M10, the transistor M11, and the transistor M12 to obtain the bias current of the main circuit of the first reference voltage source 110. The transistor M19, the transistor M20, the transistor M21, the transistor M22, the transistor M25, the transistor M26, the transistor M27, the transistor M28, and the transistor M29 constitute a single stage telescopic amplifier. A drain of the transistor M26 may be an output vref1_out of the first reference voltage source 110. The transistor M13 and the transistor M14 provide a bias voltage vref1_vp for the transistor M20 and the transistor M22. The transistor M23 and the transistor M24 provide a bias voltage vref1_vn for the transistor M25 and the transistor M26.

By adjusting the ratio of the resistance of the resistor R2 to the resistance of the resistor R1, the voltage $V_{BG}$ may present a slight negative temperature characteristic. As the temperature increases, the voltage $V_{BG}$ tends to decrease. After being buffered by the voltage buffer circuit 134 having negative temperature coefficient, the voltage at the first end of the resistor R3 also has the same characteristics. Therefore, the current passing through the resistor R3 also presents a negative temperature characteristic, and at this time, the negative temperature characteristic is characterized in that the current of the resistor R3 decreases exponentially along with the increase of the temperature. After being mirrored by the transistor M10, the transistor M11, and the transistor M12, the current presenting the negative temperature characteristic flows into the main circuit of the first reference voltage source 110. Because the current following through the output of the first reference voltage source 110 decreases, the output voltage also tends to decrease slightly. By finely adjusting the ratio of the resistor R2 to the resistor R1, the change of the output voltage of the first reference voltage source 110, which is generated along with the change of the temperature, may be adjusted to be within a range acceptable for the system.

In an embodiment, referring to FIG. 1 again, the ADC circuit 10 further includes a gain calibration circuit 140. The gain calibration circuit 140 is connected to the intermediate amplification circuit 231. The gain calibration circuit 140 in cooperation with the current source 130 having negative temperature coefficient, may eliminate a gain error caused by the mismatch between the first reference voltage source 110 and the second reference voltage source 120. The gain calibration circuit 140 may eliminate the offset of the output voltage between the first reference voltage source 110 and the second reference voltage source 120 due to temperature variations.

Figure 5:
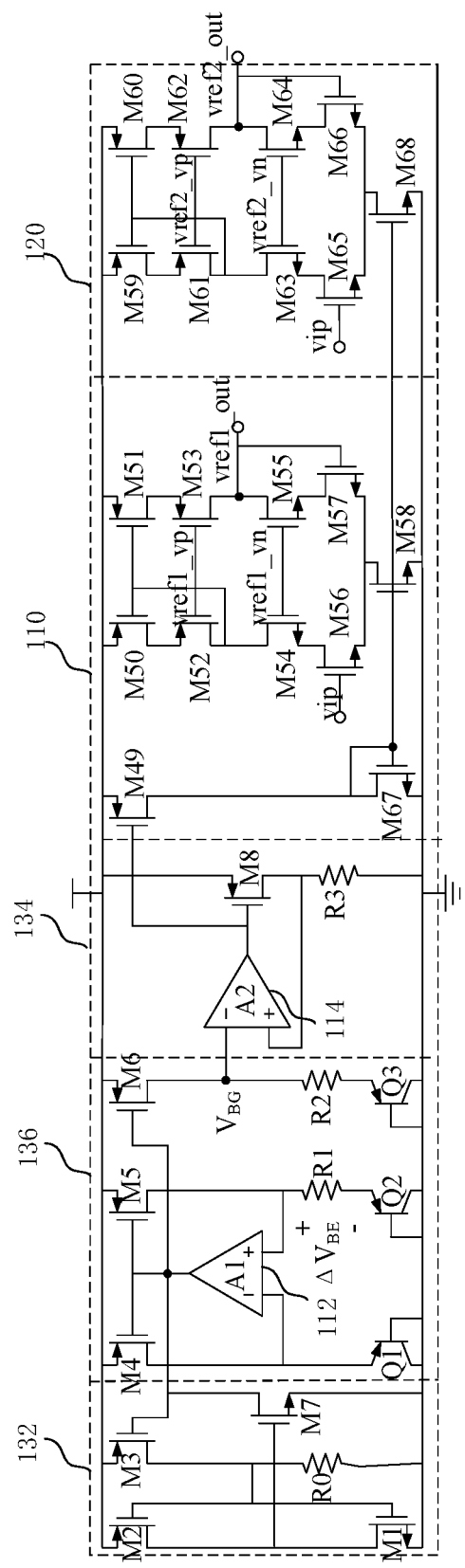
FIG. 5 is a structural diagram of the analog-to-digital conversion circuit provided by another embodiment of the present application.

Referring to FIG. 5, in an embodiment, the first reference voltage source 110 includes transistors M49 to M58 and a transistor M67. A source of the transistor M49 is connected to the external power source. A gate of the transistor M49 is connected to the output of the second operational amplifier 114. A drain of the transistor M49 is connected to a drain and a gate of the transistor M67, respectively. A source of the transistor M67 is connected to the ground.

A source of the transistor M50 is connected to the external power source, and a drain of the transistor M50 is connected to a source of the transistor M52. The drain of the transistor M52 is connected to a drain of the transistor M54. A source of the transistor M54 is connected to a drain of the transistor M56. A source of the transistor M56 is connected to a drain of the transistor M58. A source of the transistor M58 is connected to the ground. The drain of the transistor M52 is connected to a gate of the transistor M50.

A source of the transistor M51 is connected to the external power source, and a gate of the transistor M51 is connected to the gate of the transistor M50. The drain of the transistor M50 is connected to a source of the transistor M53. A gate of the transistor M53 is connected to a gate of the transistor M52. A drain of the transistor M53 is connected to a drain of the transistor M55. A gate of the transistor M55 is connected to a gate of the transistor M54. A source of the transistor M55 is connected to a drain of the transistor M57. A source of the transistor M57 is connected to a source of the transistor M56.

In an embodiment, the second reference voltage source 120 includes transistors M59 to M66 and a transistor M68. A source of the transistor M59 is connected to the external power source. A drain of the transistor M59 is connected to a source of the transistor M61. A drain of the transistor M61 is connected to a drain of the transistor M63. The drain of the transistor M61 is also connected to a gate of the transistor M59. A source of the transistor M63 is also connected to a drain of the transistor M65. A source of the transistor M65 is connected to a drain of the transistor M68. A source of the transistor M68 is connected to the ground. A gate of the transistor M68 is connected to a gate of the transistor M67.

A source of the transistor M60 is connected to the ground. A gate of the transistor M60 is connected to the gate of the transistor M59. A drain of the transistor M60 is connected to a source of the transistor M62. A drain of the transistor M62 is connected to a drain of the transistor M64. A gate of the transistor M64 is connected to a gate of the transistor M63. A source of the transistor M64 is connected to a drain of the transistor M66. A source of the transistor M66 is connected to a drain of the transistor M68. A gate of the transistor M66 is connected to the drain of the transistor M64.

The structure and the working principle of the first reference voltage source 110 may the same as those of the second reference voltage source 120. The first reference voltage source 110 is taken as an example for description. The current generated by the current source 130 having negative temperature coefficient is mirrored by the transistor M58 and the transistor M67 to obtain an end current of the main circuit of the first reference voltage source 110. The transistors M50 to M58 constitute a single stage telescopic amplifier. The drain of the transistor M15 is the output of the first reference voltage source 110.

The embodiment of the present application also provides an analog-to-digital conversion device. The analog-to-digital conversion device includes the ADC circuit 10 described in any one of the embodiments above.

The embodiment of the present application further provides a digital x-ray imaging system. The digital x-ray imaging system includes the ADC device of any one of the embodiments above.

The technical features of the embodiments above may be combined arbitrarily. In order to make the description concise, not all possible combinations of various technical features in the embodiments above are described. However, as long as there are no contradictions between the combinations of these technical features, all the combinations should be within the scope of the present specification.

The embodiments above are only several examples of the present application, and the descriptions thereof are relatively specific and detailed, but should not be interpreted as limitations on the scope of the present application. It should be noted that, for those of ordinary skill in the art, various modifications and improvements may be made without departing from the concept of the present application, and they all fall within the protection scope of the present application. Therefore, the scope of protection of the present application shall be subject to the appended claims.

What is claimed is:

1. An analog-to-digital conversion (ADC) circuit, comprising:
   a first reference voltage source;
   a second reference voltage source;
   a first analog-to-digital converter connected to the first reference voltage source;
   a second analog-to-digital converter connected to the second reference voltage source;
   a connecting circuit connected to the first analog-to-digital converter and the second analog-to-digital converter, respectively; and
   a current source having negative temperature coefficient, configured to be connected to the first reference voltage source and the second reference voltage source, respectively.

2. The ADC circuit of claim 1, wherein the ADC circuit is a two-staged analog-to-digital converter.

3. The ADC circuit of claim 1, wherein the current source having negative temperature coefficient comprises a voltage buffer circuit having negative temperature coefficient, connected to the first reference voltage source and the second reference voltage source, respectively.

4. The ADC circuit of claim 3, wherein the current source having negative temperature coefficient further comprises a voltage generating circuit having negative temperature coefficient connected to the voltage buffer circuit having negative temperature coefficient.

5. The ADC circuit of claim 4, wherein the current source having negative temperature coefficient further comprises a starting circuit connected to the voltage generating circuit having negative temperature coefficient.

6. The ADC circuit of claim 5 wherein the voltage generating circuit having negative temperature coefficient comprises a first operational amplifier having an output connected to the starting circuit.

7. The ADC circuit of claim 6, wherein the voltage generating circuit having negative temperature coefficient comprises:
   a first branch circuit connected to an inverting input of the first operational amplifier and the starting circuit; and
   a second branch circuit connected to anon-inverting input of the first operational amplifier and the starting circuit, wherein an output voltage of the voltage generating circuit having negative temperature coefficient is adjusted to have a negative temperature characteristic by adjusting the first branch circuit and the second branch circuit.

8. The ADC circuit of claim 7, wherein:
   the first branch circuit is configured to generate a current having positive temperature coefficient and to provide the current for the second branch circuit; and
   the second branch circuit is configured to generate the output voltage.

9. The ADC circuit of claim 8, wherein:
   the first branch circuit comprises a transistor M5, a bipolar junction transistor (BJT) Q2, and a resistor R1; and
   the second branch circuit comprises a transistor M6, a BJT Q3, and a resistor R2.

10. The ADC circuit of claim 9, wherein the output voltage of the voltage generating circuit having negative temperature coefficient is adjusted to have the negative temperature characteristic by adjusting a ratio of a resistance of the resistor R2 to a resistance of the resistor R1.

11. The ADC circuit of claim 10, wherein: the voltage generating circuit having negative temperature coefficient comprises a transistor M4 and a BJT Q1;
   a drain of the transistor M4 is connected to an emitter of the BJT Q1; a source of the transistor M4 is connected to the external power supply; a gate of the transistor M4 is connected to the output of the first operational amplifier; a collector and a base of the BJT Q1 are connected to the ground; and the inverting input of the first operational amplifier is connected to the drain of the transistor M4 and the emitter of the BJT Q1, respectively.

12. The ADC circuit of claim 9, wherein: the first branch circuit further comprises a transistor M5 and a BJT Q2;
   a gate of the transistor M5 is connected to the gate of the transistor M4; a source of the transistor M5 is connected to the external power supply; a drain of the transistor M5 is connected to a first end of the resistor R1 and a noninverting input of the first operational amplifier, respectively; a second end of the resistor R1 is connected to an emitter of the BJT Q2.

13. The ADC circuit of claim 9, wherein: the second branch circuit further comprises a transistor M6 and a BJT Q3;

a source of the transistor M6 is connected to the external power supply; a drain of the transistor M6 is connected to a first end of the resistor R2 and the voltage buffer circuit having negative temperature coefficient, respectively; a gate of the transistor M6 is connected to the output of the first operational amplifier; a second end of the resistor R2 is connected to an emitter of the BJT Q3.

14. The ADC circuit of claim 13, wherein: the voltage buffer circuit having negative temperature coefficient comprises a second operational amplifier;

an inverting input of the second operational amplifier is connected to the drain of the transistor M6, and an output of the second operational amplifier is connected to the first reference voltage source and the second reference voltage source, respectively.

15. The ADC circuit of claim 14, wherein: the voltage buffer circuit having negative temperature coefficient further comprises a transistor M8 and a resistor R3;

a source of the transistor M8 is connected to the external power supply, a drain of the transistor M8 is connected to a first end of the resistor R3, the first end of the resistor R3 is connected to a noninverting input of the second operational amplifier, and a second end of the resistor R3 is connected to the ground.

16. The ADC circuit of claim 1, wherein the connecting circuit includes an intermediate amplification circuit connected to the first analog-to-digital converter and the second analog-to-digital converter, respectively.

17. The ADC circuit of claim 16, further comprising a gain calibration circuit connected to the intermediate amplification circuit.

18. The ADC circuit of claim 1, wherein a structure of the first reference voltage source is the same as a structure of the second reference voltage source.

19. An analog-to-digital conversion device, comprising the analog-to-digital conversion circuit of claim 1.

20. A digital x-ray imaging system, comprising the analog-to-digital conversion device of claim 19.

\* \* \* \* \*